(12) United States Patent
Kuramochi

(10) Patent No.: US 8,059,021 B2
(45) Date of Patent: Nov. 15, 2011

(54) DIGITAL-ANALOG CONVERTING APPARATUS AND TEST APPARATUS

(75) Inventor: Yasuhide Kuramochi, Gunma (JP)

(73) Assignee: Advantest Corporation, Tokyo (JP)

( * ) Notice: Subject to any disclaimer, the term of this patent is extended or adjusted under 35 U.S.C. 154(b) by 73 days.

(21) Appl. No.: 12/641,834

(22) Filed: Dec. 18, 2009

(65) Prior Publication Data

US 2011/0148680 A1 Jun. 23, 2011

(51) Int. Cl.
*H03M 1/66* (2006.01)
(52) U.S. Cl. .................................. 341/150; 341/144
(58) Field of Classification Search .................. 341/150, 341/154, 158, 144; 345/94
See application file for complete search history.

(56) References Cited

U.S. PATENT DOCUMENTS

| | | | |
|---|---|---|---|
| 4,968,989 A | 11/1990 | Olmstead et al. | |
| 5,319,370 A | 6/1994 | Signore et al. | |
| 5,852,415 A | 12/1998 | Cotter et al. | |
| 6,144,331 A | 11/2000 | Jiang | |
| 6,169,508 B1 * | 1/2001 | Edwards | 341/150 |
| 6,215,431 B1 | 4/2001 | Sheng et al. | |
| 6,424,331 B1 | 7/2002 | Ozawa | |
| 7,271,758 B2 | 9/2007 | Piasecki et al. | |
| 7,486,205 B2 * | 2/2009 | Wegener | 341/50 |

* cited by examiner

*Primary Examiner* — Joseph Lauture
(74) *Attorney, Agent, or Firm* — Chen Yoshimura LLP

(57) ABSTRACT

Provided is a DA conversion apparatus comprising a capacitor array DA converter that outputs to an output line an output voltage corresponding to a digital value input thereto; and a load changing section that changes a size of a load capacitance connected to the output line. The load changing section may set gain of the DA conversion apparatus with the size of the load capacitance connected to the output line being a constant capacitance unaffected by the digital value. The load changing section may include a load capacitor connected between the output line and a standard potential; a load-side switch connected in series with the load capacitor between the output line and the standard potential; and a load capacitance control section that controls the load-side switch.

8 Claims, 13 Drawing Sheets

| INPUT DATA | REFERENCE VOLTAGE ($V_{REF}$) | k | d |
|---|---|---|---|
| $2^{(N-1)}-1$ | $V_{REFN}$ | $2^{(N-1)}-1$ | 0 |
| ⋮ | | ⋮ | ⋮ |
| 1 | | 1 | 0 |
| 0 | | 0 | 0 |
| −1 | $V_{REFP}$ | 0 | 1 |
| −2 | | 1 | 1 |
| ⋮ | | ⋮ | ⋮ |
| $-2^{(N-1)}$ | | $2^{(N-1)}-1$ | 1 |

FIG.9

| INPUT DATA | | REFERENCE VOLTAGE ($V_{REF}$) | k | d | OUTPUT VOLTAGE ($V_{DAC}$) |
|---|---|---|---|---|---|
| INTEGER | BINARY | | | | |
| 127 | 0111 1111 | $V_{CM}-128mV$ | 127 | 0 | $V_{CM}+127mV$ |
| ⋮ | ⋮ | ⋮ | ⋮ | ⋮ | ⋮ |
| 1 | 0000 0001 | $V_{CM}-128mV$ | 1 | 0 | $V_{CM}+1mV$ |
| 0 | 0000 0000 | $V_{CM}-128mV$ | 0 | 0 | $V_{CM}$ |
| -1 | 1111 1111 | $V_{CM}+128mV$ | 0 | 1 | $V_{CM}-1mV$ |
| -2 | 1111 1110 | $V_{CM}+128mV$ | 1 | 1 | $V_{CM}-2mV$ |
| ⋮ | ⋮ | ⋮ | ⋮ | ⋮ | ⋮ |
| -128 | 1000 0000 | $V_{CM}+128mV$ | 127 | 1 | $V_{CM}-128mV$ |

FIG. 12

DIGITAL-ANALOG CONVERTING APPARATUS AND TEST APPARATUS

BACKGROUND

1. Technical Field

The present invention relates to a DA conversion apparatus and a test apparatus.

2. Related Art

A conventional charge redistribution DA converter is known. The charge redistribution DA converter is provided with an internal capacitor array in which the capacitors are connected in a ladder formation.

The charge redistribution DA converter charges the capacitor array with an amount of charge corresponding to a standard voltage during a first half of the period of the data rate, and this is known as the "refresh mode." During the second half of the each period of the data rate, the charge redistribution DA converter switches the connection of the capacitor array according to the input data, and this is known as the "output mode." As a result, the charge redistribution DA converter can generate a voltage corresponding to the input data. This charge redistribution DA converter consumes less power than other types of DA converters.

Such a charge redistribution DA converter, however, causes linearity, offset, and gain errors in the output voltage because of the output capacitance. To correct these errors, the DA converter uses a complicated circuit configuration including another internal DA converter, and this increases the area of implementation. Furthermore, there is a technique for performing the gain correction or the like in a digital region, but when performing a digital calculation, the accuracy of the correction is limited by the accuracy of the DA converter.

Patent Document 1: U.S. Pat. No. 5,319,370
Patent Document 2: U.S. Pat. No. 6,144,331
Patent Document 3: U.S. Pat. No. 7,271,758
Patent Document 4: U.S. Pat. No. 5,852,415
Patent Document 5: U.S. Pat. No. 4,968,989
Patent Document 6: U.S. Pat. No. 6,215,431
Patent Document 7: U.S. Pat. No. 6,424,331

SUMMARY

Therefore, it is an object of an aspect of the innovations herein to provide a DA conversion apparatus and a test apparatus, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary signal generating apparatus may include a signal generating apparatus that outputs from an output end thereof an output voltage corresponding to input data supplied thereto, comprising a DA converter that outputs a voltage corresponding to data supplied thereto; a capacitor section that is provided between the output end and a standard potential; a transmission switch that provides a connection or a disconnect between a voltage generating end of the DA converter and the output end; and a control section that causes the DA converter to charge the capacitor section with a voltage corresponding to the input data by repeatedly connecting and disconnecting the transmission switch, and thereby causes the voltage of the capacitor section to gradually approach the output voltage corresponding to the input data.

The summary clause does not necessarily describe all necessary features of the embodiments of the present invention.

The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 9 shows values for the reference voltage, a parameter k, a parameter d selected according to pieces of input data $-2^{(N-1)}$ to $2^{(N-1)}-1$ provided thereto.

FIG. 12 shows exemplary values for the reference voltage, the parameter k, and the parameter d along with the resulting output voltages when input data from −128 to 127 is provided.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
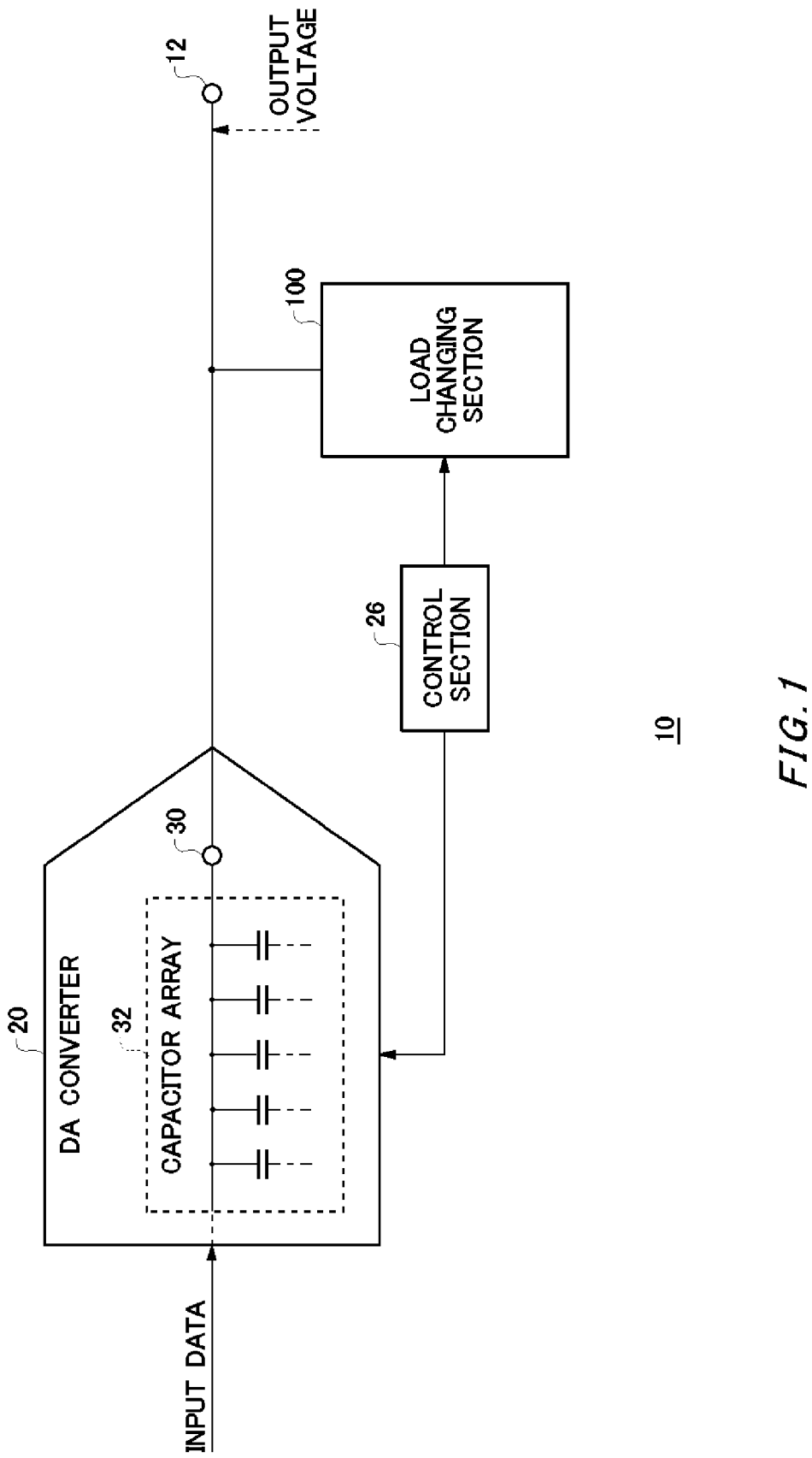
FIG. 1 shows a configuration of a DA conversion apparatus 10 according to an embodiment of the present invention.

FIG. 1 shows a configuration of a DA conversion apparatus 10 according to an embodiment of the present invention. The DA conversion apparatus 10 outputs from an output end 12 an output voltage corresponding to input data supplied thereto. The DA conversion apparatus 10 includes a DA converter 20, a control section 26, and a load changing section 100.

The DA converter 20 outputs to an output line a voltage corresponding to an input digital value. In the present embodiment, the DA converter 20 is a charge redistribution DA converter that includes a capacitor array 32. In the present embodiment, the capacitor array 32 inside the DA converter 20 is connected directly to the voltage generating end 30 of the DA converter 20 without a buffer or the like therebetween.

The DA converter 20 switches from a refresh mode during which a charge according to a standard voltage is accumulated in the capacitor array 32 and an output mode during which a voltage corresponding to input data is generated from the voltage generating end 30, by switching a connection arrangement of the capacitor array 32 in which the charge is stored according to the input data. When input data is supplied to the DA conversion apparatus 10, the DA converter 20 alternates between the refresh mode and the output mode during which the voltage generating end 30 generates the voltage corresponding to the input data. Instead, the DA converter 20 may continuously operate over a prescribed interval for a single accumulation.

The control section 26 causes the DA converter 20 to alternate between the refresh mode and the output mode according to the input data supplied to the DA conversion apparatus 10. Therefore, the control section 26 can cause the DA converter 20 to repeatedly output from the voltage generating end 30 thereof a voltage corresponding to the input data.

The load changing section 100 is provided between the output end 12 and a standard potential, and changes the size of the load capacitance connected to the output line. Here, the load capacitance refers to a variable capacitance provided between a circuit connected to an output end of the DA converter 20 and the standard potential or another potential, and is in parallel with the circuit connected to the output end of the DA converter 20. The load changing section 100 may change the size of the load capacitance based on a control signal from the control section 26. The DA conversion apparatus 10 corrects the output voltage of the output line between the DA converter 20 and the load capacitance by receiving a portion of the charge according to the set load capacitance.

Figure 2:
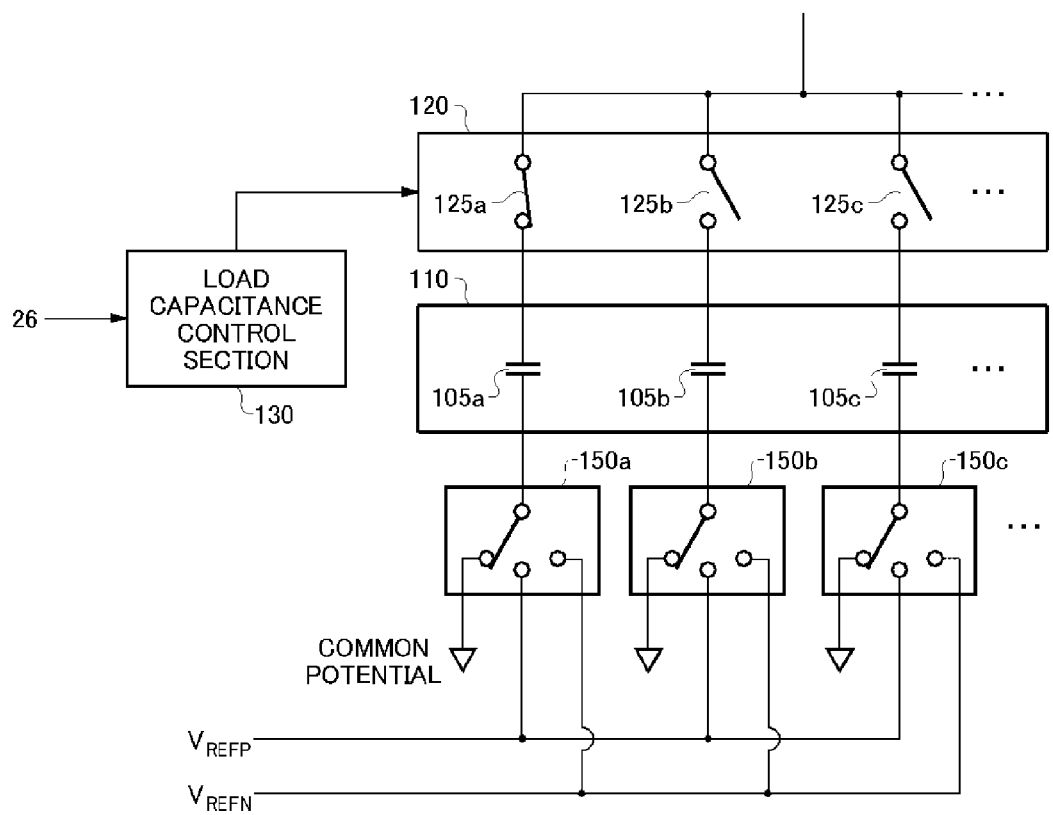
FIG. 2 shows a configuration of the load changing section 100 according to the present embodiment.

FIG. 2 shows a configuration of the load changing section 100 according to the present embodiment. The load changing section 100 includes a load capacitance section 110, a switching section 120, a load capacitance control section 130, and a standard potential changing section 150.

The load capacitance section 110 includes a plurality of load capacitors 105 connected between the output line and the standard potential. The switching section 120 includes a plurality of load-side switches 125 that switch whether each of the load capacitors 105 is connected between the output line and the standard potential. Each load-side switch 125 may provide a connection between the output line and a corresponding load capacitor 105. Instead, each load-side switch 125 may provide a connection between the standard potential changing section 150 and a corresponding load capacitor 105. The load capacitance section 110 changes the load capacitance connected to the output line using the switching section 120.

The load capacitance control section 130 controls which combination of switches are connected from among the plurality of load-side switches 125. The load capacitance control section 130 receives a control signal from the control section 26 and, during the output period and the refresh period of the DA converter 20, connects the same combination of switches from among the plurality of load-side switches 125.

The standard potential changing section 150 selects the reference potential to be either a common potential or a standard potential according to a setting. Here, the common potential may be 0 V. The DA conversion apparatus 10 can correct the offset voltage of the output voltage emitted from the voltage generating end 30, by using the standard potential changing section 150 to select the standard potential.

Here, the capacitor array 32 inside the DA converter 20 is connected directly to the voltage generating end 30 of the DA converter 20 without having a buffer or the like therebetween. Accordingly, charge moves between (i) the load capacitors 105 connected to the reference potential in the load capacitance section 110 and (ii) the capacitor array 32 inside the DA converter 20, such that the voltage emitted from the voltage generating end 30 becomes equal to the voltage of the load capacitance section 110, i.e. the output voltage.

Accordingly, the control section 26 alternates between the refresh mode and the output mode, thereby causing a voltage corresponding to the input data to be repeatedly generated from the DA converter 20 and causing the voltage corresponding to the input data to be output from the voltage generating end 30. The control section 26 also controls the selection of the standard potential and the combination of connected load-side switches 125 of the load changing section 100 to correct the voltage emitted from the voltage generating end 30.

Figure 3:
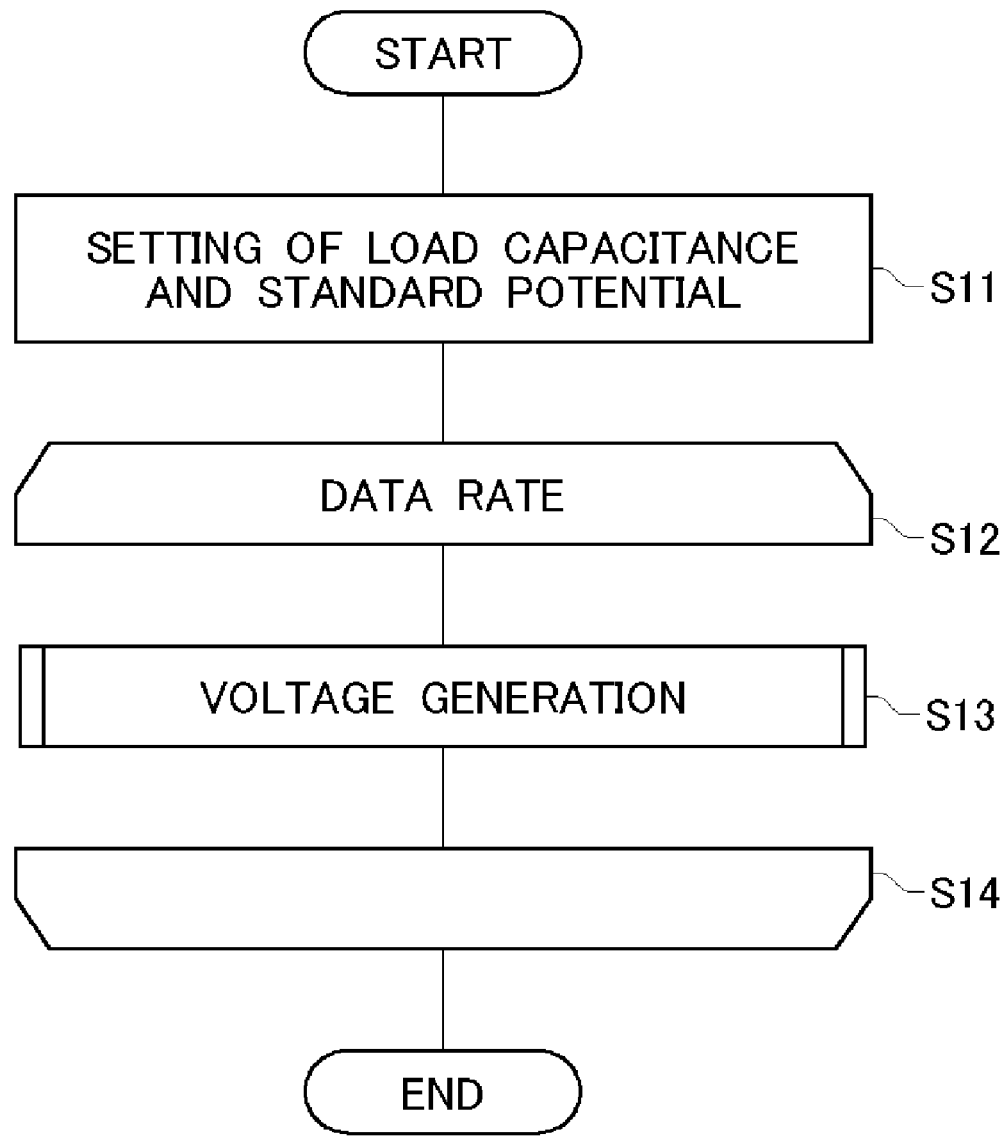
FIG. 3 shows a process flow of the DA conversion apparatus 10 according to the present embodiment.

FIG. 3 shows a process flow of the DA conversion apparatus 10 according to the present embodiment. The DA conversion apparatus 10 may set the load capacitance of the load capacitance section 110 (S11). The DA conversion apparatus 10 may select the standard potential using the standard potential changing section 150.

When voltage V is applied to the load capacitance C and a stable state is reached, the load capacitance accumulates a charge q that is proportional to the applied voltage such that q=CV. However, when there is a capacitance error such as parasitic capacitance in the load capacitance C, which serves as a proportional coefficient, an offset error and a gain error occur. Furthermore, when the load capacitance C is the result of a load capacitance containing a plurality of capacitance errors, the load capacitance C causes a linearity error in the capacitance relative to the applied voltage, according to the capacitance distribution ratio. Accordingly, the DA conversion apparatus 10 outputs a voltage upon which is superimposed the effect of each of the load capacitance errors. Furthermore, when there are errors in a plurality of capacitances in the capacitor array 32, the error of each of these capacitances is also superimposed on the voltage.

Therefore, the load changing section 100 sets the gain of the DA conversion apparatus 10 while maintaining a steady capacitance unaffected by the digital value for the load capacitance connected to the output line. The load changing section 100 may measure each error in the load capacitance of the plurality of load capacitors 105 in advance, store a combination of load capacitors 105 that results in a constant load capacitance unaffected by the input digital value, and set the combination stored by the load changing section 100.

In order to correct the linearity error, the offset error, and/or the gain error of the load capacitance, the load changing section 100 may change the standard potential using the standard potential changing section 150. For example, the load changing section 100 may correct the output voltage by selecting an appropriate standard potential and setting for the load capacitor 105 as described above. The correction of the output voltage by the load changing section 100 is described in further detail with regard to FIGS. 4 to 6.

The DA conversion apparatus 10 repeats the processes of step S12 to step S13 for each data rate, i.e. each time input data is supplied (the process loop from S12 to S14). At the voltage generation step (S13), the DA conversion apparatus 10 causes the DA converter 20 to generate a voltage corresponding to the input data. The voltage generation process by the DA converter 20 is described in relation to FIG. 8.

In the present embodiment, the DA conversion apparatus 10 setting the load capacitance of the load capacitance section 110 is described first, and then process loop for generating voltage for each data rate is described thereafter. Instead, the DA conversion apparatus 10 may set the load capacitance of the load capacitance section 110 for each data rate. The DA conversion apparatus 10 may connect a suitable number of load capacitors 105 to the output line according to the input digital value, and select a standard potential to be connected to the load capacitors 105.

Figure 4:
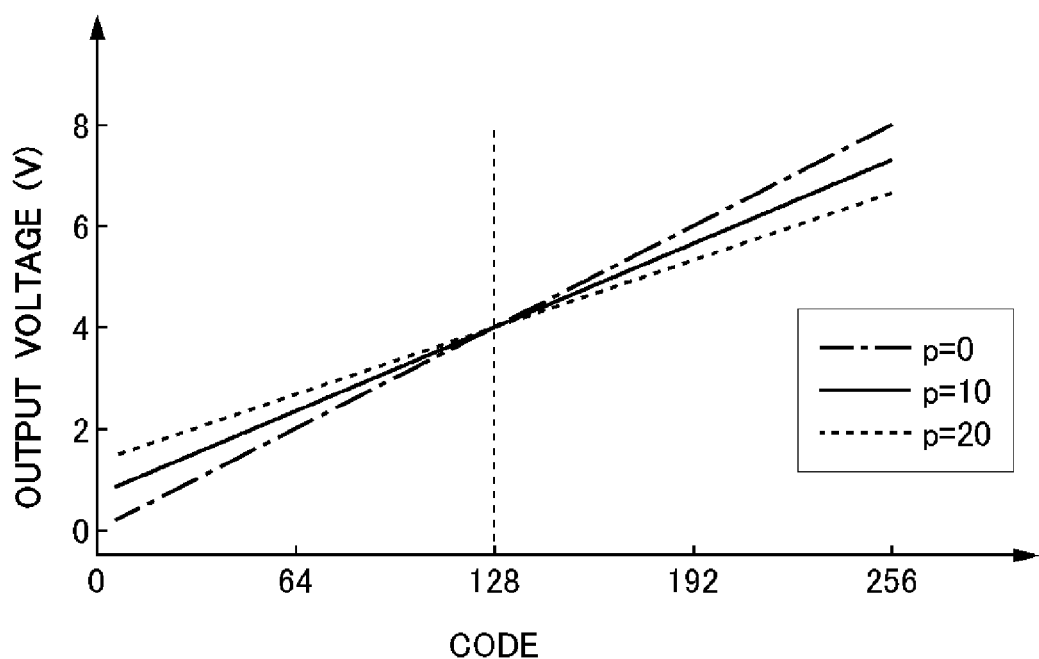
FIG. 4 shows an example of the output voltage when the load changing section 100 according to the present embodiment sets the common potential as the reference potential.

FIG. 4 shows an example of the output voltage when the load changing section 100 according to the present embodiment sets the common potential as the reference potential. The horizontal axis represents the code of the input digital value, which in this example is an 8-bit value from 0 to 255, and the vertical axis represents the output voltage. In this example, the linearity of the output voltage relative to the input digital value is correct, but the gain characteristic contains an error. In FIG. 4, p represents the number of switches that are connected from among the plurality of load-side switches 125.

When the number of connected load-side switches 125 is zero, the output voltage of the DA conversion apparatus 10 is simply the output of the DA converter 20. When a common potential of 0 V is set as the reference voltage of the load changing section 100, the charge amount of the common potential increases when the number of connected load-side switches 125 increases, and so the DA conversion apparatus 10 causes the output voltage to approach the common potential, which decreases the slope relative to the input digital value. Accordingly, with a code position (near 128 in FIG. 4) that corresponds to the common potential on the vertical axis and the common potential on the horizontal axis set as a central point, an increase in the number of connected load-side switches 125 causes the slope to be corrected in a clockwise direction, i.e. a direction that decreases the slope.

Figure 5:
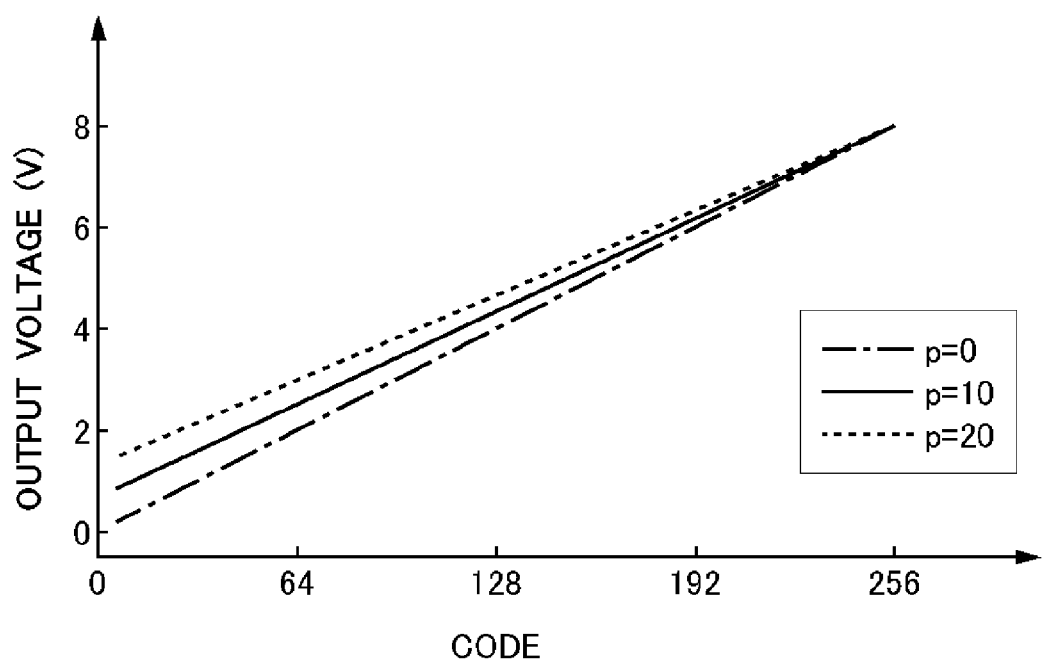
FIG. 5 shows an exemplary output voltage when the reference voltage of the load changing section 100 according to the present embodiment is positive.

FIG. 5 shows an exemplary output voltage when the reference voltage of the load changing section 100 according to the present embodiment is a positive reference potential. In FIG. 5, the horizontal axis, vertical axis, numbers, and symbols are substantially the same as those in FIG. 4, and further explanation is omitted.

When the number of connected load-side switches 125 is zero, the output voltage of the DA conversion apparatus 10 is simply the output of the DA converter 20. When the reference voltage of the load changing section 100 is a positive reference potential, the charge amount of the positive reference potential increases when the number of connected load-side switches 125 increases, and so the DA conversion apparatus 10 causes the output voltage to approach the positive standard potential, which decreases the slope relative to the input digital value. Accordingly, with a code position (255 in FIG. 5) that corresponds to a positive reference potential on the vertical axis and a positive reference potential on the horizontal axis set as a fixed point, an increase in the number of connected load-side switches 125 causes the slope to be corrected in a clockwise direction, i.e. a direction that decreases the slope.

Figure 6:
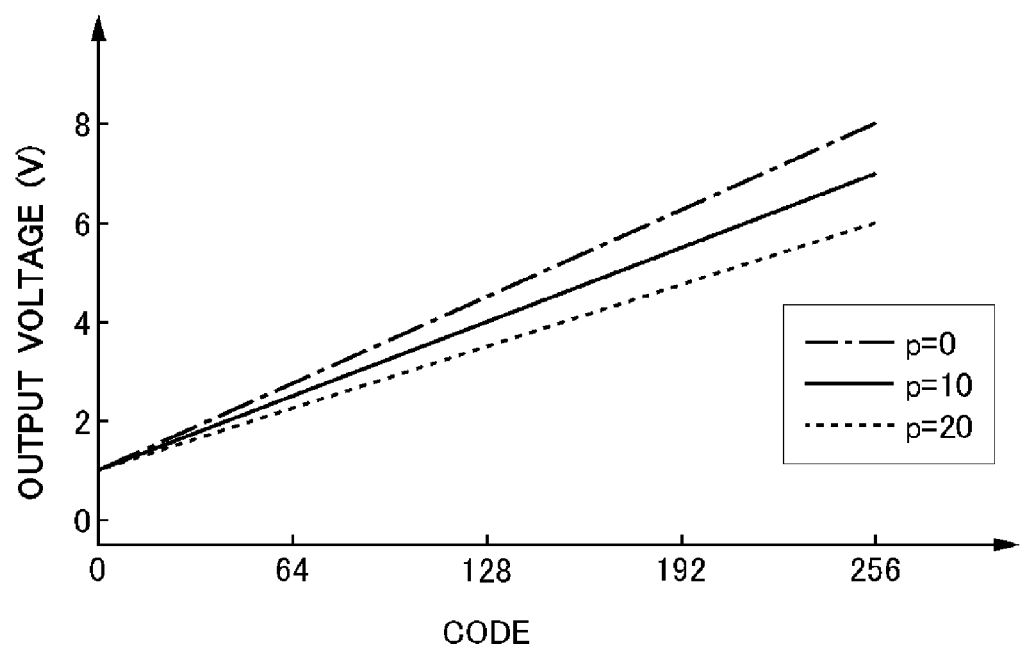
FIG. 6 shows an exemplary output voltage when the reference voltage of the load changing section 100 according to the present embodiment is negative.

FIG. 6 shows an exemplary output voltage when the reference voltage of the load changing section 100 according to the present embodiment is a negative reference potential. In FIG. 6, the horizontal axis, vertical axis, numbers, and symbols are substantially the same as those in FIG. 4, and further explanation is omitted.

When the number of connected load-side switches 125 is zero, the output voltage of the DA conversion apparatus 10 is simply the output of the DA converter 20. When the reference voltage of the load changing section 100 is a negative reference potential, the charge amount of the negative reference potential increases when the number of connected load-side switches 125 increases, and so the DA conversion apparatus 10 causes the output voltage to approach the negative standard potential, which decreases the slope relative to the input digital value. Accordingly, with a code position (0 in FIG. 6) that corresponds to a negative reference potential on the vertical axis and a negative reference potential on the horizontal axis set as a fixed point, an increase in the number of connected load-side switches 125 causes the slope to be corrected in a clockwise direction, i.e. a direction that decreases the slope.

In the examples shown in FIGS. 4 to 6, a DA conversion apparatus 10 is described in which a suitable number of load capacitors 105 are connected to the same reference potential for correcting the output voltage by the load-side switch 125. Instead, each load capacitor 105 may be connected to an appropriate reference potential, and the correction may be performed by connecting an appropriate number of load capacitors 105 to the output end 12.

The DA conversion apparatus 10 according to the present embodiment described above can correct the linearity error, offset error, and gain error thereof by keeping the size of the load capacitance connected to the output line constant regardless of the digital value and by setting an appropriate standard potential for the load changing section 100. The DA conversion apparatus 10 can perform these error corrections without using a complex circuit, and requires only a simple circuit including a plurality of load capacitors 105, a plurality of load-side switches 125, and a standard potential changing section 150.

The DA conversion apparatus 10 can perform the corrections over a wide range spanning almost all input digital values. Furthermore, when correcting the gain, the DA conversion apparatus 10 can perform the correction appropriately by selecting the fulcrum of the slope. The load changing section 100, which is a circuit used for the correction, can perform the correction while consuming little power by using almost no resistors. Furthermore, since the basis for the correction operation is the movement of charge, the DA conversion apparatus 10 can perform the correction quickly. Yet further, the DA conversion apparatus 10 can perform the correction using only one reference potential.

Figure 7:
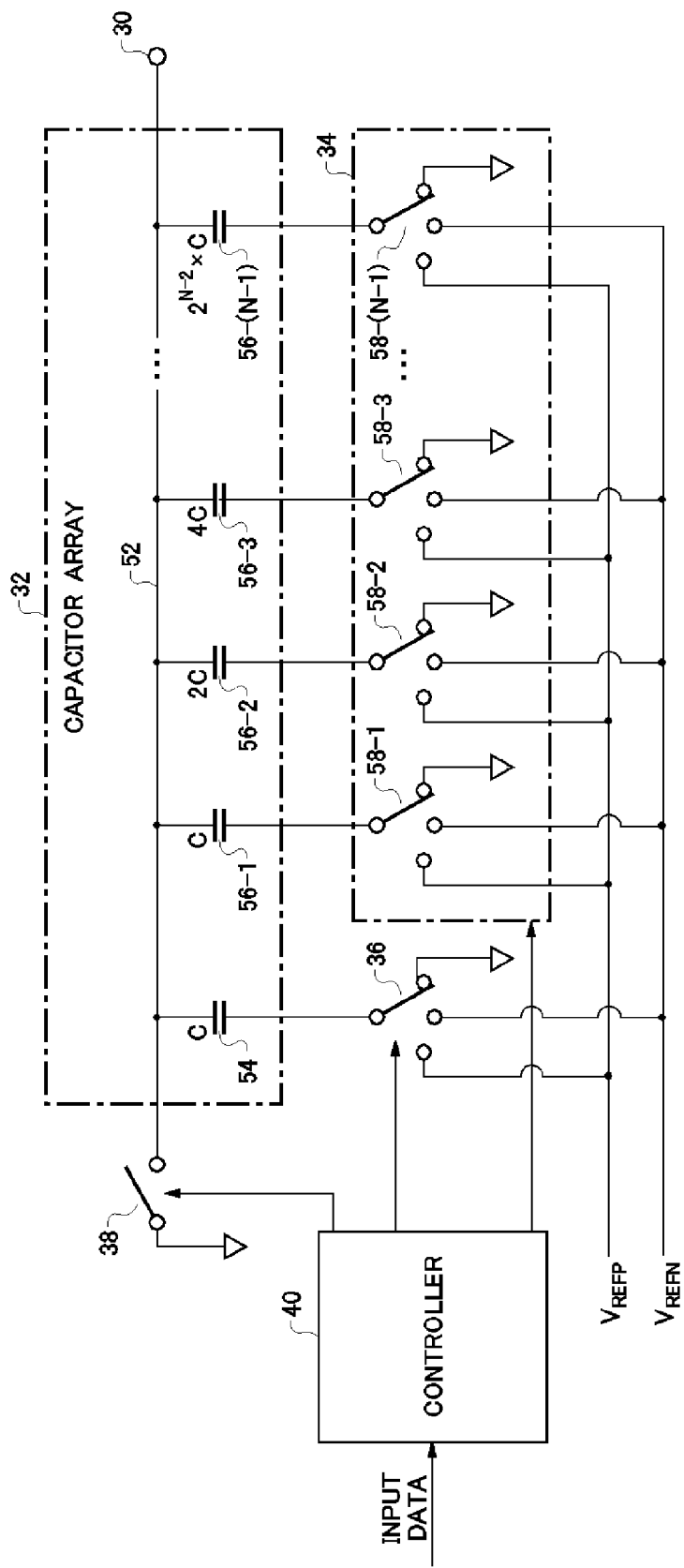
FIG. 7 shows an exemplary configuration of the DA converter 20 according to an embodiment of the present invention.

FIG. 7 shows an exemplary configuration of the DA converter 20 according to an embodiment of the present invention. The DA converter 20 includes (i) a plurality of parallel capacitors provided to correspond respectively to the bits of the digital value and each having one end thereof connected to the output line, (ii) a plurality of parallel switches provided to correspond respectively to the bits of the digital value and each connecting the other end of the corresponding parallel capacitor to the reference potential or the common potential according to the value of the corresponding bit, and (iii) a conversion control section that controls the parallel switches. The conversion control section controls each of the parallel switches during the refresh period to connect the each of the parallel capacitors to the reference potential, and controls each of the parallel switches during the output period to connect each of the parallel capacitors to the reference potential or the common potential according to the value of the corresponding bit. During the refresh period and the output period, the load capacitance control section 130 connects the same switches from among the load-side switches.

The DA converter 20 generates a voltage according to N-bit input data, where N is an integer greater than 2. The DA converter 20 includes the capacitor array 32, a switching section 34, a dummy switch 36, a refresh switch 38, and a controller 40, which is the conversion control section. The capacitor array 32 is connected to the voltage generating end 30. The capacitor array 32 includes an output line 52, a dummy capacitor 54, and bit capacitors 56-1 to 56-(N−1).

The output line 52 is connected to the voltage generating end 30 without a buffer or the like therebetween. The dummy capacitor 54 has one end thereof connected to the output line 52. The dummy capacitor 54 has a capacitance corresponding to the weighting of a first bit, i.e. least significant bit, of the input data.

Each of the bit capacitors 56-1 to 56-(N−1) has one end thereof connected to the output line 52. Each of the bit capacitors 56-1 to 56-(N−1) corresponds to one of the first to (N−1)th bits of the input data, and has a capacitance according to the weighting of the corresponding bit. In the following example, it is assumed that two types of reference potential are used, e.g. a positive reference potential $V_{REFP}$ and a negative reference potential $V_{REFN}$, the first bit has a capacitance C, the second bit has a capacitance 2×C, the third bit has a capacitance $2^2$×C, and the (N−1)th bit has a capacitance $2^{(N-2)}$×C.

The switching section 34 switches the connections of the capacitor array 32. The switching section 34 includes bit switches 58-1 to 58-(N−1). The bit switches 58-1 to 58-(N−1) correspond respectively to the bit capacitors 56-1 to 56-(N−1). Each of the bit switches 58-1 to 58-(N−1) connects the other end of the corresponding bit capacitor 56, which is the end of the bit capacitor 56 not connected to the output line 52, to one of the positive reference potential $V_{REFP}$, the negative reference potential $V_{REFN}$, and the common potential $V_{CM}$.

The dummy switch 36 connects the other end of the dummy capacitor 54, which is the end not connected to the output line 52, to one of the positive reference potential $V_{REFP}$, the negative reference potential $V_{REFN}$, and the common potential $V_{CM}$. The refresh switch 38 switches whether the end of the output line 52 on the side opposite the voltage generating end 30 is connected to the common potential $V_{CM}$. The controller 40 controls the switching of the switching section 34, the dummy switch 36, and the refresh switch 38 according to the input data supplied thereto.

Here, the positive reference potential $V_{REFP}$ and the negative reference potential $V_{REFN}$ are voltages with opposite polarities centered on the common potential $V_{CM}$, and both have the same difference relative to the common potential $V_{CM}$. The common potential $V_{CM}$ is represented by the inverted triangle marks in FIG. 7. The common potential $V_{CM}$ may be a ground potential, for example. The DA converter 20 described above can generate an analog voltage divided with an N-bit resolution between the positive reference potential $V_{REFP}$ and the negative reference potential $V_{REFN}$.

Figure 8:
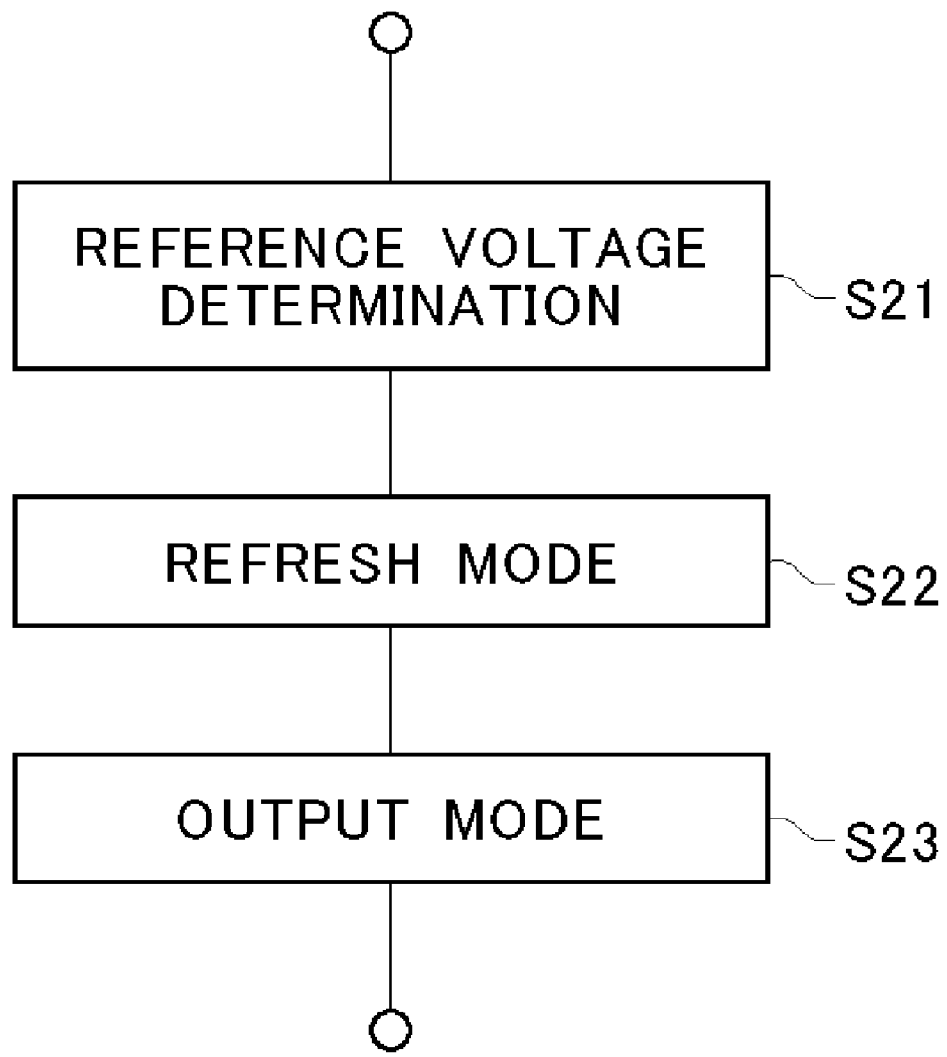
FIG. 8 shows a process flow of the voltage generation by the DA converter 20 according to the present embodiment.
Figure 10:
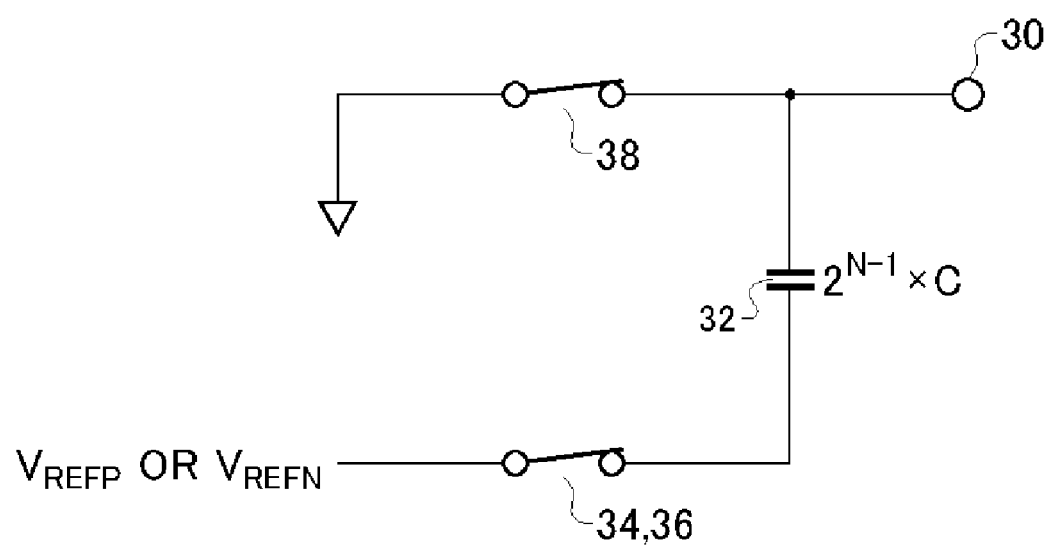
FIG. 10 shows an exemplary connection of the DA converter 20 according to the present embodiment during the refresh mode.
Figure 11:
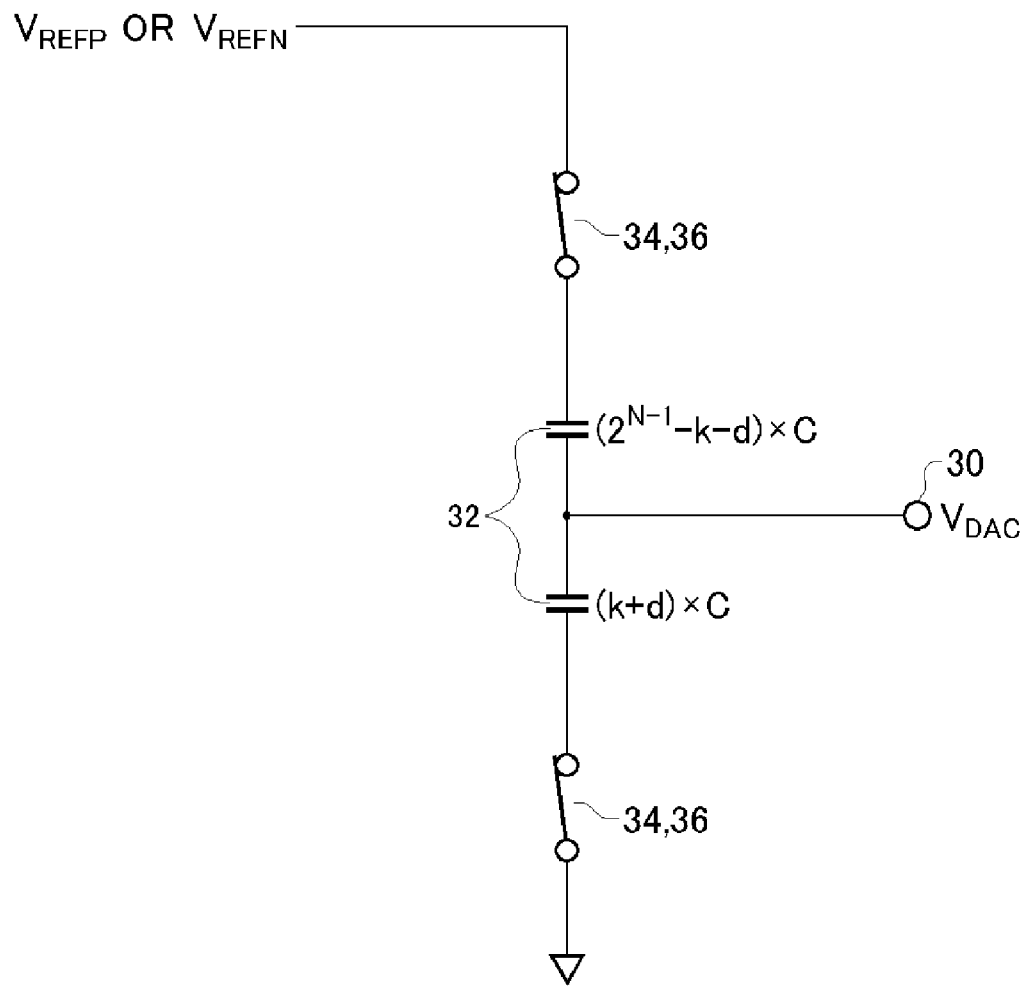
FIG. 11 shows an exemplary connection of the DA converter 20 according to the present embodiment during the output mode.

FIG. 8 shows a process flow of the voltage generation by the DA converter 20 according to the present embodiment. FIG. 9 shows values for the reference voltage, a parameter k, and a parameter d selected according to pieces of input data $-2^{(N-1)}$ to $2^{(N-1)}-1$ provided thereto. FIG. 10 shows an exemplary connection of the DA converter 20 according to the present embodiment during the refresh mode. FIG. 11 shows an exemplary connection of the DA converter 20 according to the present embodiment during the output mode.

First, at step S21, the controller 40 of the DA converter 20 selects one of the positive reference potential $V_{REFP}$ and the positive reference potential $V_{REFP}$ according to the input data supplied thereto. More specifically, the controller 40 selects the positive reference potential $V_{REFP}$ when the input data is less than the central value of the data range, and selects the negative reference potential $V_{REFN}$ when the input data is greater than or equal to the central value of the data range.

For example, the controller 40 selects the positive reference potential $V_{REFP}$ and the negative reference potential $V_{REFN}$ according to the value of the most significant bit, i.e. the Nth bit, of the input data. In the example of FIG. 9, the DA converter 20 is supplied with input data with a range from $-2^{(N-1)}$ to $2^{(N-1)}-1$. In this case, the controller 40 selects the positive reference potential $V_{REFP}$ when the input data is between $-2^{(N-1)}$ and −1, inclusive, and selects the negative reference potential $V_{REFN}$ when the input data is between 0 and $2^{(N-1)}-1$, inclusive.

Furthermore, the controller 40 calculates the parameter k used for switching the bit capacitors 56-1 to 56-(N−1) of the capacitor array 32 according to the input data, for example. The parameter k is a (N−1)-bit value, which is 1 bit less than the input data. The controller 40 selects k to be a value that is greater when the input data is further from the central value of the data range. For example, in the example of FIG. 9, the controller 40 selects k to be from $2^{(N-1)}1$ to 0 when the input data is from $-2^{(N-1)}$ to −1. The controller 40 selects k to be from 0 to $2^{(N-1)}-1$ when the input data is from 0 to $2^{(N-1)}-1$.

The controller 40 may select the parameter d used for switching the dummy capacitor 54 according to the input data. The parameter d is a 1-bit value. The controller 40 selects the parameter d to be 1 when the input data is less than the central value of the data range, and selects the parameter d to be 0 when the input data is greater than or equal to the central value of the data range. In the example of FIG. 9, the controller 40 selects the parameter d to be 1 when the input data is from $-2^{(N-1)}$ to −1, and selects the parameter d to be 0 when the input data is from 0 to $2^{(N-1)}-1$.

Next, at step S22, the controller 40 enters the refresh mode. In the refresh mode, the controller 40 charges the capacitor array 32 to the selected reference potential.

More specifically, as shown in FIG. 10, the controller 40 connects the refresh switch 38. The controller 40 switches the switching section 34 and the dummy switch 36 to connect the other ends of all of the bit capacitors 56 and the dummy capacitor 54 of the capacitor array 32, which are the ends not connected to the output line 52, to the selected reference potential, which is the positive reference potential $V_{REFP}$ or the negative reference potential $V_{REFN}$.

Next, at step S23, the controller 40 of the DA converter 20 enters the output mode. In the output mode, the controller 40 switches the ratio between (i) the capacitance between the common potential $V_{CM}$ and the voltage generating end 30 in the capacitor array 32 and (ii) the capacitance between the reference potential and the voltage generating end 30, according to the input data, to generate from the voltage generating end 30 a voltage corresponding to the input data.

For example, the bit capacitors 56-1 to 56-(N−1) correspond one-to-one with the first through (N−1)th bits of the parameter k expressed as a binary value. The controller 40 connects each of the bit capacitors 56-1 to 56-(N−1) to the reference potential selected when the corresponding bit of the parameter k is 0, which is either the positive reference potential $V_{REFP}$ or the negative reference potential $V_{REFN}$, and connects each of the bit capacitors 56-1 to 56-(N−1) to the common potential $V_{CM}$ when the corresponding bit of the parameter k is 1. Furthermore, the controller 40 connects the dummy capacitor 54 to the selected reference potential when the parameter d is 0, and connects the dummy capacitor 54 to the common potential $V_{CM}$ when the parameter d is 1.

As a result, as shown in FIG. 11, the controller 40 switches the switching section 34 and the dummy switch 36 such that a capacitance of (k+d)×C is connected between the voltage generating end 30 and the common potential $V_{CM}$ and a capacitance of $(2^{N-1}-k-d)$×C is connected between the voltage generating end 30 and the selected reference potential, which is the positive reference potential $V_{REFP}$ or the negative reference potential $V_{REFN}$. Therefore, the DA converter 20 can output an output voltage $V_{DAC}$ as shown below in Expression 1.

$$V_{DAC} = \{(2^{N+1}+k+d) \times V_{CM} - (k+d) \times V_{REF}\}/2^{N-1} \quad \text{Expression 1}$$

In Expression 1, $V_{REF}$ represents the selected $V_{REFP}$ or $V_{REFN}$.

FIG. 12 shows exemplary values for the reference voltage, the parameter k, and the parameter d along with the resulting output voltages when input data from −128 to 127 is provided and 1 LSB=1 mV. By generating the voltage with the settings shown in FIG. 12, the DA converter 20 can output a voltage that changes in steps of 1 mV within a range from $V_{CM}$−128 mV to $V_{CM}$+127 mV, according to the input data with a range from −128 to 127 supplied thereto.

As a result of the above process, the DA converter 20 can generate an analog voltage corresponding to N-bit input data supplied thereto. The configuration of the DA converter 20 of the present embodiment is not limited to the configuration described in FIGS. 7 to 12, and a charge redistribution DA converter having a different configuration and performing a different process may be used. Furthermore, the DA converter 20 of the present embodiment is supplied with input data with a range from $-2^{(N-1)}$ to $2^{(N-1)}-1$, but the range of the input data is not limited to this, and may be a different range such as from 0 to $2^N-1$ or $-(2^N-1)$ to 0.

The DA conversion apparatus 10 in which the DA converter 20 described above is connected to the load changing section 100 with p of the load-side switches 125 in the connected state can output from the output end 12 thereof an output voltage $V_D$ shown below in Expression 2.

$$V_D = \{(2^{N+1}+k+d) \times V_{CM} - (k+d) \times V_{REF} + p \times V_b\}/(2^{N-1}+p) \quad \text{Expression 2}$$

In Expression 2, $V_b$ represents the common potential $V_{CM}$ or the reference potential, i.e. $V_{REFP}$ or $V_{REFN}$, selected by the standard potential changing section 150 according to the settings. It is seen from Expression 2 that, as a result of the standard potential changing section 150 selecting the standard potential $V_b$, the voltage $V_{DAC}$ generated by the DA converter 20 can be offset.

With the DA conversion apparatus 10 of the present embodiment described above, the linearity error, the offset error, and the gain error of the DA conversion apparatus 10 can be corrected by changing the size of the load capacitance of the load changing section 100 connected directly to the DA converter 20. Here, in order to decrease the noise that occurs when a charge redistribution DA converter switches between the refresh mode and the output mode, the DA conversion apparatus 10 may connect a switch to the output end 12 to control whether the DA conversion apparatus 10 is connected to an external output. The DA conversion apparatus 10 may switch this switch in synchronization with the alternation of the DA converter 20 between the refresh mode and the output mode.

Figure 13:
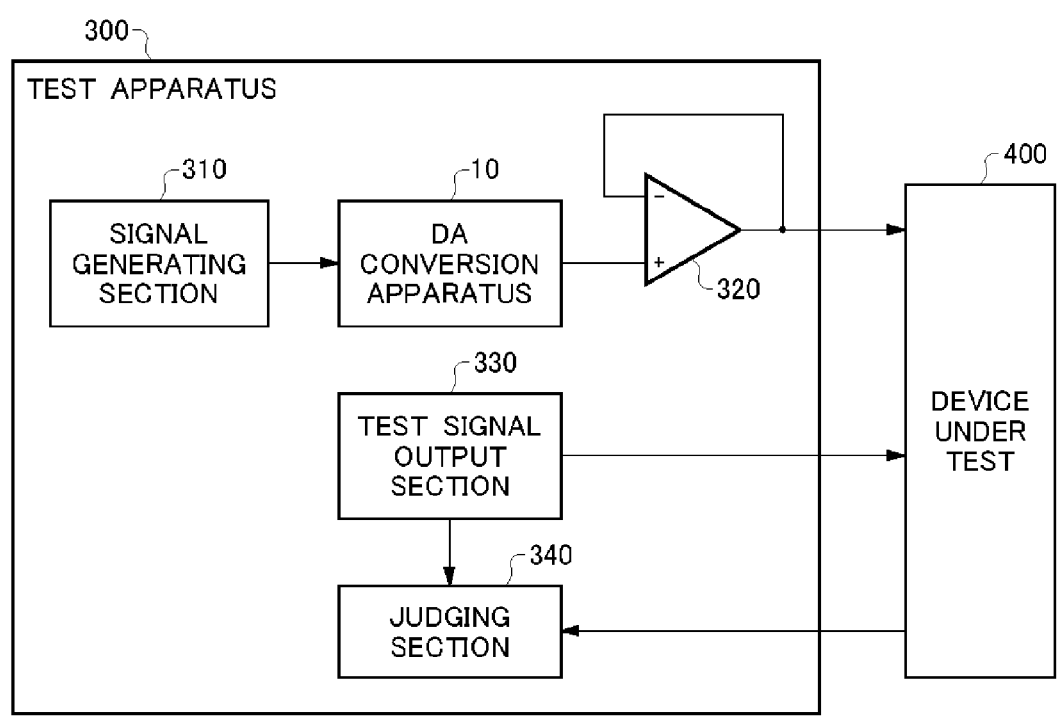
FIG. 13 shows a configuration of a test apparatus 300 according to an embodiment of the present invention, along with a device under test 400.

FIG. 13 shows a configuration of a test apparatus 300 according to an embodiment of the present invention, along with a device under test 400. The test apparatus 300 tests the device under test 400, which may be an analog circuit, a digital circuit, a memory, a system on chip (SOC), or the like.

The test apparatus 300 includes a signal generating section 310, the DA conversion apparatus 10, a drive section 320, a test signal output section 330, and a judging section 340. The DA conversion apparatus 10 generates a voltage to be supplied to the device under test 400. The DA conversion apparatus 10 has the same configuration as the DA conversion apparatus 10 described in relation to FIGS. 1 to 12, and therefore further description is omitted.

The signal generating section 310 outputs the voltage supplied to the device under test 400 to the DA conversion apparatus 10 as a digital value. The DA conversion apparatus 10 outputs an output voltage corresponding to the input data supplied thereto. The drive section 320 supplies the device under test 400 with the voltage generated by the DA conversion apparatus 10. The drive section 320 may be a power amplifier, for example.

The test signal output section 330 outputs a test signal to the device under test 400. The test signal output section 330 may output to the judging section 340 an expected value that is expected to be output from the device under test 400 in response to the test signal. The judging section 340 receives from the device under test 400 a response signal in response to the test signal. The judging section 340 judges acceptability of the device under test 400 based on the received response signal. With this test apparatus 300, the device under test 400 can be supplied with an accurate voltage from the DA conversion apparatus 10.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A DA conversion apparatus comprising:
  a capacitor array DA converter that outputs to an output line an output voltage corresponding to a digital value input thereto; and
  a load changing section that changes a size of a load capacitance connected to the output line, wherein
  the load changing section sets gain of the DA conversion apparatus by adjusting the size of the load capacitance connected to the output line the size of the load capacitance being set to a constant capacitance unaffected by the digital value once the gain is set.

2. The DA conversion apparatus according to claim 1, wherein
  the load changing section includes:
    a load capacitor connected between the output line and a standard potential;
    a load-side switch connected in series with the load capacitor between the output line and the standard potential; and
    a load capacitance control section that controls the load-side switch.

3. The DA conversion apparatus according to claim 2, wherein
  the load-side switch is connected between the output line and the load capacitor.

4. The DA conversion apparatus according to claim 2, wherein
  the load changing section includes:
    a plurality of the load capacitors; and a plurality of the load-side switches that respectively switch whether the plurality of load capacitors are connected between the output line and the standard potential, and the control section controls a combination of switches to be connected from among the plurality of load-side switches.

5. The DA conversion apparatus according to claim 4, wherein the DA converter includes:
- a plurality of parallel capacitors that are provided to correspond to a plurality of bits of the digital value and that each have one end thereof connected to the output line;
- a plurality of parallel switches that are provided to correspond to the plurality of bits of the digital value and that each connect an other end of the corresponding parallel capacitor to a reference potential or a common potential according to a value of the corresponding bit; and
- a conversion control section that controls the plurality of parallel switches, the conversion control section controls each of the plurality of parallel switches during a refresh period to connect each of the plurality of parallel capacitors to the reference potential and, during an output period, connects each of the plurality of parallel capacitors to the reference potential or to the common potential according to the value of the corresponding bit, and during the refresh period and the output period, the load capacitance control section connects the same combination of switches from among the plurality of the load-side switches.

6. The DA conversion apparatus according to claim 5, wherein the load changing section further includes a standard potential changing section that changes the standard potential.

7. The DA conversion apparatus according to claim 6, wherein the standard potential changing section selects the standard potential to be either the reference potential or the common potential, according to a setting.

8. A test apparatus that tests a device under test, comprising:
- a signal generating section that generates a digital signal designating a voltage value of a test signal to be supplied to a terminal of the device under test;
- the DA conversion apparatus according to claim 1 that receives the digital signal and outputs an output voltage according to the received digital signal; and
- a voltage supply section that supplies a test voltage corresponding to the output voltage to a terminal of the device under test.

* * * * *